United States Patent [19]

Mikami et al.

[11] Patent Number: 4,614,958

[45] Date of Patent: Sep. 30, 1986

[54] LIGHT EMITTING AND RECEIVING DEVICE

[75] Inventors: Kazuo Mikami; Fumihiko Satoh; Mikihiko Shimura, all of Nagaokakyo, Japan

[73] Assignee: Omron Tateisi Electronics Co., Kyoto, Japan

[21] Appl. No.: 748,703

[22] Filed: Jun. 25, 1985

Related U.S. Application Data

[63] Continuation of Ser. No. 349,821, Feb. 18, 1982, abandoned.

[30] Foreign Application Priority Data

Feb. 23, 1981 [JP] Japan .................................. 56-25097

[51] Int. Cl.⁴ .................. H01L 29/161; H01L 33/00; H01L 31/12; H01L 27/14
[52] U.S. Cl. ......................................... 357/19; 357/16; 357/17; 357/30; 357/55; 372/50
[58] Field of Search ...................... 357/16, 17, 19, 30, 357/55; 372/48, 50

[56] References Cited

U.S. PATENT DOCUMENTS

| | | | |
|---|---|---|---|
| 4,134,642 | 1/1979 | Kapron et al. | 350/96.33 |
| 4,275,404 | 6/1981 | Cassiday et al. | 357/19 |
| 4,320,410 | 3/1982 | Nishizawa | 357/19 |
| 4,388,633 | 6/1983 | Vasudev | 357/19 |

FOREIGN PATENT DOCUMENTS

| | | | |
|---|---|---|---|
| 54-37597 | 3/1979 | Japan | 357/19 |
| 55-98880 | 7/1980 | Japan | 357/19 |
| 56-4288 | 1/1981 | Japan | 357/19 |
| 55-39643 | 3/1986 | Japan | 357/19 |

OTHER PUBLICATIONS

J. Katz et al, "A Monolithic Integration of GaAs/GaAlAs Bipolar Transistor and Heterostructure Laser", *Applied Physics Letters*, vol. 37 (15 Jul. 1980) pp. 211–213.

S. Sakai et al, "Integrated Light Emitters and Photodetectors for Dual-Channel Optical Communication", Conference: Sixth European Conference on Special Communication, York, England, (1980) pp. 230–233.

C. Lanza et al, "Image Converter with Built-In Gain", *IBM Technical Disclosure Bulletin*, vol. 16, (1973) pp. 842–843.

*Primary Examiner*—James J. Carroll
*Attorney, Agent, or Firm*—Cushman, Darby & Cushman

[57] ABSTRACT

At least one set of light emitting element, converting an electric signal into an optical signal, and light receiving element, converting an optical signal into an electric signal, is integrated into one chip of semiconductor device.

5 Claims, 20 Drawing Figures

LIGHT EMITTING AND RECEIVING DEVICE

This is a continuation of application Ser. No. 349,821, filed Feb. 18, 1982, which was abandoned upon the filing hereof.

BACKGROUND OF THE INVENTION

This invention relates to a light emitting and receiving device constituted by semiconductors capable of performing both conversion from an electric signal to an optical signal and from an optical signal to an electric signal.

A light emitting diode has been generally used in a wide circle as a semiconductor light emitting element for the conversion of an electric signal into an optical signal.

Similarly a photodiode or phototransistor has been generally used in a wide circle as a semiconductor light receiving element for the conversion of an optical signal into an electric signal.

Integration of the light emitting element and the light receiving element into a semiconductor chip enables the elimination of conventional problems as described below.

For a bidirectional communication system with a single optical fiber, each of the transmitting-receiving devices is necessary to provide a light emitting element for feeding an optical signal to the optical fiber and a light receiving element for receiving the optical signal transmitted in the optical fiber. Since the light emitting element and the light receiving element are respectively independent devices, conventionally the both elements have been almost impossible to be optically coupled in good efficiency directly to an end face of an optical fiber due to the area of the end face of the optical fiber and the dimensions of the both elements. Therefore, practically the end part of an optical fiber is divided through a divider/coupler into two optical fibers at the light emitting side and the light receiving side to couple both the light emitting element to the end face of the optical fiber at the light emitting side and the light receiving element to the end face of the optical fiber at the light receiving side. However, in this arrangement, a large amount of propagation loss is caused by the divider/coupler interposed in an optical transmission passage. The above loss comprises not only the connection loss of the divider/coupler but those essentially inevitable caused by dividing light in the main line optical fiber into two optical fibers.

To eliminate the above described problem, the following method has been usually proposed. Both constructional elements of similar P-N junction, can perform conversions from electricity to light and from light to electricity. This enables the constitution of a semidouble optical communication system by coupling a light emitting diode or photodiode to the end face of a single optical fiber and allowing this element of diode to function as the light emitting element at the time of transmission and simultaneously as the light receiving element at the time of reception. However, devices designed as a light emitting diode and designed as a photodiode, even though they are the elements of the same P-N junction construction, are largely different from each other in their optimum element constitution. Thus, it is almost impossible to obtain a single P-N junction element capable of satisfying both required luminous efficiency and light receiving sensitivity. Accordingly, using a light emitting diode also for light reception, its light receiving sensitivity remarkably and must be complemented by electrical amplification in a rear stage, resulting in a system with lower noise resistance.

The above described problem in the past can be also solved by use of an optical fiber reflection photoelectric switch. The optical fiber reflection photoelectric switch is of such constitution that a light emitting element and light receiving element are coupled to the base end side of an optical fiber to irradiate light from the light emitting element to the outside from a point end of the optical fiber, then its reflected light is again guided from the point end of the above described optical fiber and detected by the above described light receiving element.

BRIEF SUMMARY OF THE INVENTION

It is an object of this invention to provide a microminiaturized light emitting and receiving device in which a light emitting element and light receiving element are integrated into a single chip and a luminous surface of the light emitting element is closely adjacent to a light receiving surface of the light receiving element. In this light emitting and receiving device, the light emitting element and the light receiving element can be optically coupled with good efficiency to the end face of an optical fiber.

Another object of this invention is to provide a light emitting and receiving device integrated into a chip with a set of light emitting and light receiving elements having high enough level of sensitivity for light emitted from the light emitting element. In the application of this light emitting and receiving device, an optical fiber reflection photoelectric switch can be constituted for coupling an optical fiber to said device.

Further object of this invention is to provide a light emitting and receiving element in which the constitutional layer of a light emitting element and light receiving element is partially formed common in a chip. In this light emitting and receiving element, element construction is simplified and capable of performing integration in high density further eliminating unnecessary external wire connection.

Further object of this invention is to provide a light emitting and receiving device with both light emitting and receiving elements in such a manner that light from the light emitting element can be efficiently guided to an optical fiber. Further light from the optical fiber can be received by the light receiving element without any of loss.

Still further object of this invention is to provide a highly sensitive light emitting and receiving device amplifying a photo current to a light receiving element integrated with a light emitting element. In this light emitting and receiving device, an externally attached amplifier for amplifying a light receiving signal is not required, improving noise reduction.

Still further object of this invention is to provide a light emitting and receiving device in which a plurality of sets of light emitting and light receiving elements are integrated into a chip. Further, light of different wave length is handled by the light emitting and light receiving element in each set.

DETAILED DESCRIPTION OF THE INVENTION

Referring now particularly to the first example of a light emitting and receiving device relating to this invention, there is provided the description in accordance with a manufacturing process as shown in FIGS. 1–5.

Figure 1:
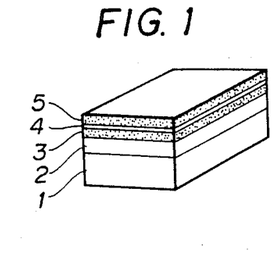
FIGS. 1–5 are views to explain a manufacturing process in the first modification of a device relating to this invention.

FIG. 1 shows the construction of a wafer. This wafer is prepared in such a manner that in addition to the growth of an undoped $n^-$-type GaAs layer 2 of non-dope onto a $n^+$-type GaAs substrate 1 of carrier concentration about $5 \times 10^{17} - 3 \times 10^{18}$ the epitaxial growth of a n-type $Al_{0.3}Ga_{0.7}As$ layer 3 (Sn or Te dope 0.5–1 μm thick), p-type $Al_{0.05}Ga_{0.95}As$ layer 4 (Ge dope 0.3–0.5 μm thick) and n-type $Al_{0.35}Ga_{0.65}As$ layer 5 (Sn or Te doped 3–5 μm thick) are successively performed.

For the epitaxial growth a liquid phase epitaxial growth device used with a carbon slide board is applied.

Such a wafer as constituted in the above described manner is of so-called double hetero construction in which a p-type active layer 4 performing light emission or reception is interposed to be held by an n-type layer 3 and 5 with a high band gap.

Figure 2:
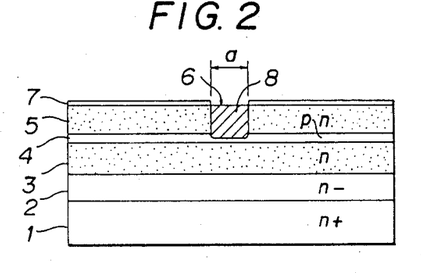

Then as shown in FIG. 2, the deposition of a $Si_3N_4$ film 7 is applied to the other portion of the n-type layer 5 excepting a round portion of diameter (a) in its central part to be used as an emission window 6, and Zn is selectively diffused at 800° C. into a quartz angle with ZnAs as the diffusion source, thus a p-type diffusion layer 8 is formed in such a manner as intrude into the p-type $Al_{0.05}Ga_{0.95}As$ layer 4.

Figure 3:
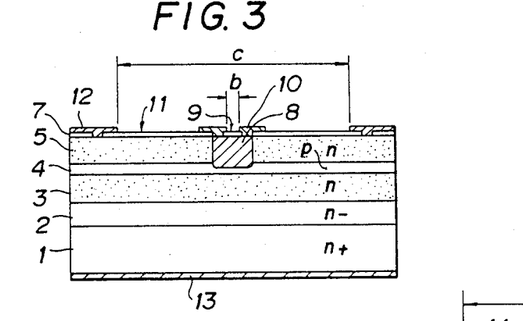

Further, as shown in FIG. 3, a bottom surface of the $n^+$-type GaAs substrate 1 is sharpened to thinly form the whole body of the wafer to a thickness about 100–200 μm. Then, the evaporation deposition of a p-type electrode 10 of Au-Zn is applied in a ring-shape to the center portion of the n-type layer 5 with the exception of the portion for an emission window 9 in diameter (b). Further to the peripheral portion of the n-type layer 5 a ring-shaped n-type electrode 12 of Au-Zn is evaporation deposited with the exception of a ring-shaped incidence window 11 in diameter (c). Still further to the bottom surface of the $n^+$-type substrate 1 there is applied the evaporation deposition of an n-type electrode 13 of Au-Ge-Ni. Then heat treatment is applied for about 1–3 minutes in the hydrogen atmosphere at about 400° C. Finally the above described electrodes 10, 12, 13 can be obtained for use as an electrode of ohmic quality.

Figure 4:
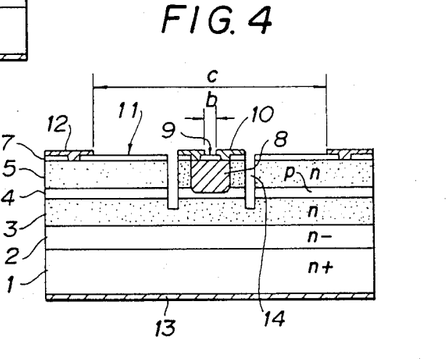

Then as shown in FIG. 4, to separate a light emitting diode part comprising the emission window 9 (luminous surface) in the central part from a phototransistor part comprising an incidence window 11 (light receiving surface) in the periphery of said light emitting diode part, a round shaped groove 14 is formed in the boundary portion between both diode and transistor parts. Groove 14 reaches a position of the n-type $Al_{0.3}Ga_{0.7}As$ layer 3. This groove 14 is formed by mesa etching with use of etching liquid of sulfuric acid, for instance, the liquid ($3H_2SO_4$; $1H_2O$ The appearance of a light emitting and receiving device prepared in such means as described above is shown in FIG. 5.

Figure 5:
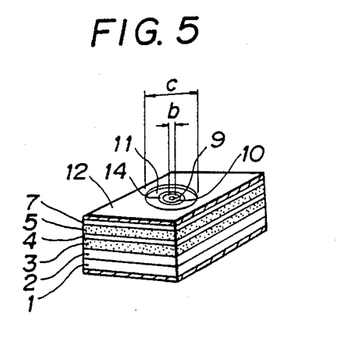

In this light emitting and receiving device, there are integrated into a chip of semiconductor device a base open phototransistor of NPN construction, with n-type layers 3, 2, 1 as the collector, p-type layer 4 as the base and n-type layer 5 as the emitter, and a light emitting diode of PN construction with n-type layers 3, 2, 1 as the cathode and p-type diffusion layer 8 as the anode. The emission window 9 (luminous surface) of the above described light emitting diode is situated at the central part of the incidence window 11 (light receiving surface) in the above described phototransistor in such a manner as to be surrounded by said incidence window 11, and the area of the above described light receiving surface is considerably greater than the light emitting surface. Further an n-type collector layer of the above described phototransistor is formed in common with an n-type cathode layer of the above described light emitting diode. While the p-type anode layer 8 of the above described light emitting diode is provided in the central part of the n-type emitter layer 5 in the above described phototransistor, further this p-type anode layer 8 is separated from the above described n-type emitter layer 5 by the groove 14 formed in the periphery of said layer 8. There is a schematic view of FIG. 6 showing this light emitting and receiving device represented by circuit symbols.

Figures 6, 7, 8:
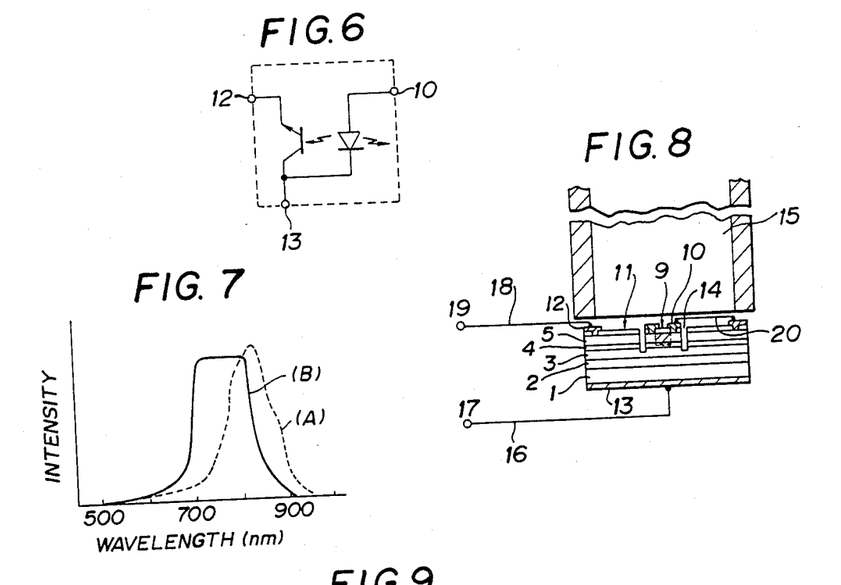
FIG. 6 is a view showing the device of the first example with circuit symbols.
FIG. 7 is a diagram of light emitting and light receiving spectrum characteristics in the device of the first example.
FIG. 8 is a view showing the coupling state of an optical fiber to the device of the first example.

Assuming 50 μm for diameter (b) of the above described light emission window 9, about 40 μm for width of the above described groove 14 and 500 μm for diameter (c) of the above described incidence window 11, there are obtained the distribution of light emitting spectra from the above described light emitting diode as shown in FIG. 7 (A) and the sensitivity distribution of spectra in the above described photodiode as shown in FIG. 7 (B), in which a common range of wave length is contained between the light emitting spectrum distribution and the spectrum sensitivity distribution.

The luminous characteristic, as shown in the FIG. 7 (A), is provided with a particular quality having a peak point at about 820 μm with the peak wave length slightly shifted toward the side of longer wave length than the wave length corresponding to band gap energy of the P-type layer 4 of an active layer. This is caused by a primary factor thermally obtained from a temperature rise or the like in the active layer.

For the light reception characteristic, as shown in FIG. 7 (B), the detectable wave length region of its element is from about 650 nm at the short wave length side to about 840 nm at the reception of absorption in the p-type layer 4. This value corresponds to the respective band gap energy 1.88 ev and 1.48 ev of the p-type layer 4 and n-type layer 5.

Figure 9:
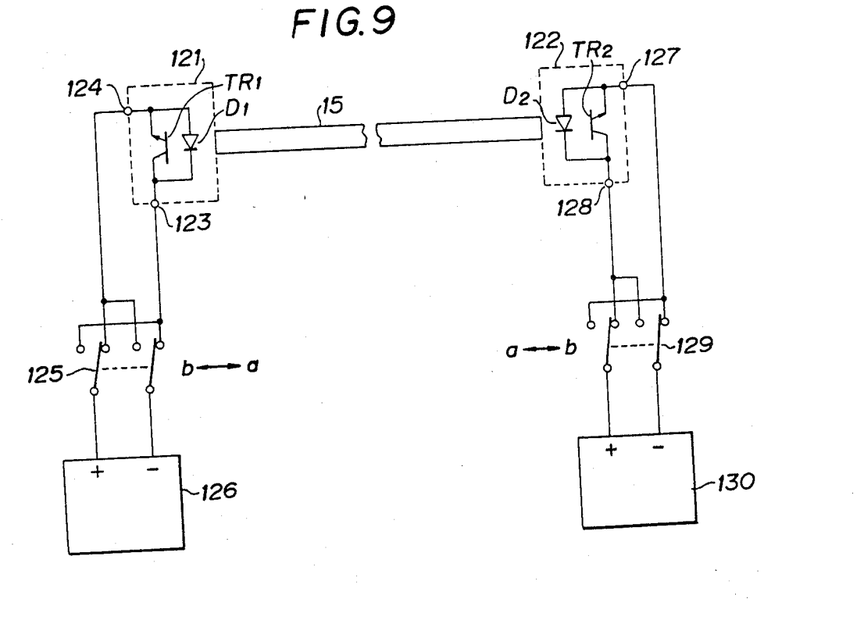
FIG. 9 is a diagram for an optical communication system with the device of the first example.

Now there is shown in FIG. 8 a modification of a light emitting and receiving device as applied to an optical communication system. Referring to the Figure, the light emitting and receiving device described in detail by FIGS. 1-6 is constituted such that sides of the incidence window 11 and the emission window 9 are closely arranged to the end face of an optical fiber 15 performing transmission-reception of optical data while the electrode 13 is connected to an external take-off terminal 17 through a lead wire 16. Then, the electrode 12 is connected to an externally take-off terminal 19 through a lead wire 18. Further, the electrodes 12 and 10 are arranged in a common connection by a lead wire 20. In this way, there can be obtained a parallel connection of the light emitting diode and the phototransistor with reverse polarity to each other. Then as shown in FIG. 9, to both ends of the fiber 15 light emitting and receiving devices 121 and 122 are arranged respectively while to terminals 123 and 124 at both ends of the light emitting and receiving device 121 a transmission circuit 126 is connected through a transmission-reception selector switch 125. On the other hand, also at the other end side of the fiber 15 terminals 127 and 128 of the light emitting and receiving device 122 are connected similarly to the above to a transmission circuit 130 through a transmission-reception selector switch 129.

For an optical communication system as described, in case of feeding optical data from the side of the light emitting and receiving device 121 to the side of the light emitting and receiving device 122, if the transmission-reception selector switch 125 is turned to its transmission side (a) and the transmission-reception selector switch 129 to its reception side (b), an electric current flows not in a phototransistor TR, but in a forward direction in a light emitting diode $D_1$ of the light emitting and receiving device 121. Thus, an electric signal from the transmission circuit 126 is converted into an optical signal in the light emitting diode $D_1$ and fed to the optical fiber 15.

Further, at the reception side, the polarity of a bias signal given from the transmission circuit 130 is reversely provided to a light emitting diode $D_2$ and in a forward direction for a phototransistor TR2, then an optical signal introduced into the optical fiber 15 is converted into an electric signal by the phototransistor TR2.

For feeding an optical signal from a side of the light emitting and receiving device 122 and receiving the said optical signal at a side of the light emitting and receiving device 121, there are only required selecting operations of the transmission-reception selector switches 125 and 129 turned to their side reversely to the above described manner.

As described above, in the light emitting and receiving device of this invention consisting of semiconductor device integrated into a chip, the semiconductor is coupled to the end face of an optical fiber, then introduction of an optical signal into the optical fiber and reception of the optical signal from the optical fiber can be performed with very high efficiency. Particularly, the phototransistor, being formed relatively wide in its light receiving area and being provided with an amplifying action for a photo currrent, has very high sensitivity to receiving light.

Now referring to the second example of the light emitting and receiving device relating to this invention, there is provided the description in accordance with FIGS. 10-16.

Figure 10:
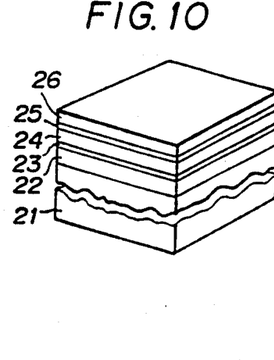
FIGS. 10–13 are views to explain a manufacturing process in the second example of the device relating to this invention.

FIG. 10 shows a view of the wafer in which a p-type GaAs layer 23, n-type $Al_{0.3}Ga_{0.7}As$ layer 24 (Sn or Te dope 3 μm thick), $Al_{0.05}Ga_{0.95}As$ layer 25 of non-dope and p-type $Al_{0.3}Ga_{0.7}As$ layer 26 (Ge dope 3 μm thick) are allowed to successively perform epitaxial growth on top of the growth of an $n^-$-type undoped GaAs layer 22 on an $N^{30}$-type GaAs substrate 21 of carrier concentration about $5 \times 10^{17} - 3 \times 10^{18}$.

For epitaxial growth, a liquid phase epitaxial growth device is applied in which a normal carbon slide board is used.

This wafer comprises a light emitting diode of double hetero construction, in which the light emitting $Al_{0.05}Ga_{0.95}As$ layer 25 is interposed between p-type $Al_{0.3}Ga_{0.7}As$ layer 26 and n-type $Al_{0.3}Ga_{0.7}As$ layer 24 with a high band gap, and a base open hetero junction phototransistor having a wide gap emitter with the light receiving n-type $Al_{0.3}Ga_{0.7}As$ layer 24 as the emitter, p-type GaAs layer 23 as the base and $n^-$-type GaAs layer 22 as the collector.

Figure 11:
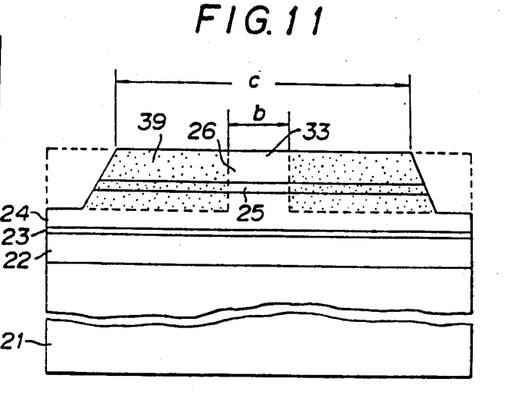

Now referring to FIG. 11, a $H^+$ ion is implanted by an ion implantation device to the central part of the p-type $Al_{0.3}Ga_{0.7}As$ layer 26 in the above described wafer excepting a round shaped part 33 in diameter (b), and mesa etching is performed by using etching liquid of sulfuric acid ($3H_2SO_4$: $1H_2O_2$:$1H_2O$) to the part excepting a round shaped part in diameter (c). An ion implanted layer 34 reaches a position of the n-type $Al_{0.3}Ga_{0.7}As$ layer 24 to form a high resistance layer with good permeability of light. Then the deposition of a $Si_3N_4$ film 39 is applied to the whole body.

Figure 12:
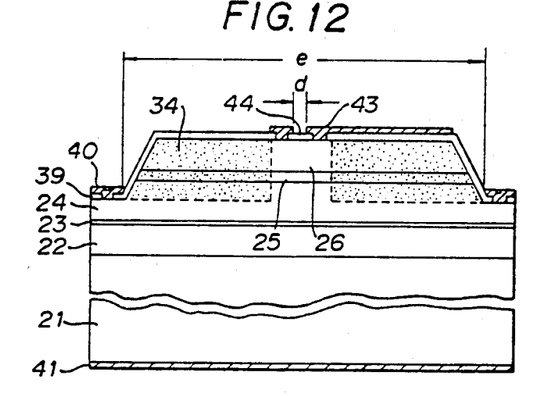

Then the $n^+$-type GaAs substrate 21 of the above described wafer is polished to thinly form the whole body of the wafer to a thickness of about 100-200 μm, and then as shown in FIG. 12 a P-type electrode 43 of Au-Zn is evaporation deposited to the central part at a side of the p-type $Al_{0.3}Ga_{0.7}As$ layer 26 except a round shaped portion 44 in diameter (d) used as the emission window of light. Next an n-type electrode 40 of Au-Ge is evaporation deposited to the peripheral portion of said electrode 43 except a round shaped portion in diameter (e) used as the incidence window of light, and an n-type electrode 41 of Au-Ge-Ni is evaporation deposited to the side of the $n^+$-type GaAs substrate 21. All electrodes can be used as an electrode of ohmic quality by applying heat treatment for about 1-3 minutes in the hydrogen atmosphere at 400° C.

Figure 13:
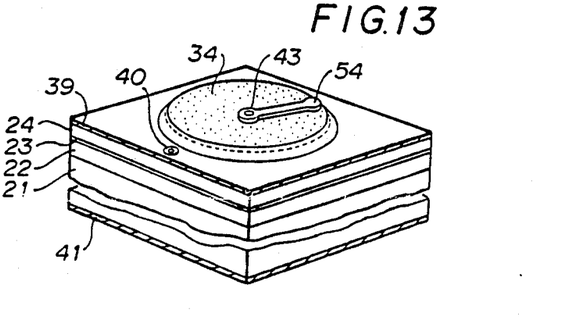

FIG. 13 is a diagonal view showing the element in FIG. 12. A P-type electrode 43 of Au-Zn is guided to a peripheral portion 54 of the diameter (c) to complete the wafer element by applying the wire bonding.

Figure 14:
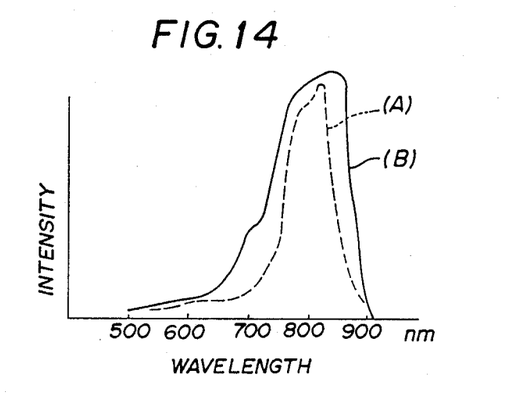
FIG. 14 is a diagram of light emitting and receiving spectrum characteristics in the device of the second example.

A full line (B) in FIG. 14 shows a sensitivity characteristic of light receiving spectrum in this device. It can be understood that the thin $Al_{0.05}Ga_{0.95}As$ layer 25 absorbs little light and a detectable region of wave length of this element is from about 700 nm at the side of short wave length to about 870 nm at a position of absorption by the p-type GaAs layer 22. These correspond to the respective band gap energy 1.75 eV and 1.4 eV.

A dotted line (A) in FIG. 14 shows the characteristic of light emitting spectrum in this device. The light emitting spectrum is of such shape with the peak wave length slightly shifting toward the side of longer wave length than the wave length corresponding to band gap energy of the Al0.05Ga0.95As layer 25 of active layer. This is caused by a primary factor thermally produced by a temperature rise or the like in the active layer. As shown in the FIG. it is understood that the light emitting spectrum is fully enclosed in a region of detectable wave length of the light receiving spectrum sensitivity characteristic. Accordingly, because the emitted light is all detectable, this device can be used for the before described single fiber bidirectional communication system as the light emission-reception integrally formed element having both functions of emitting and receiving light.

Figure 15:
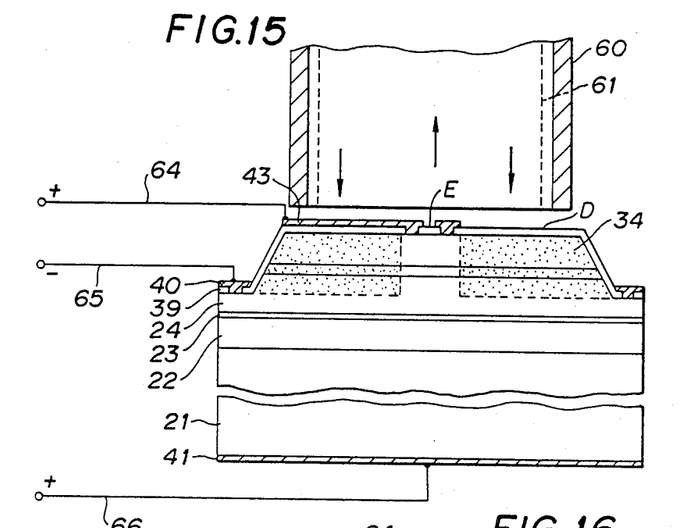
FIG. 15 is a view showing the coupling state of the optical fiber to the device of the second example.
Figure 16:
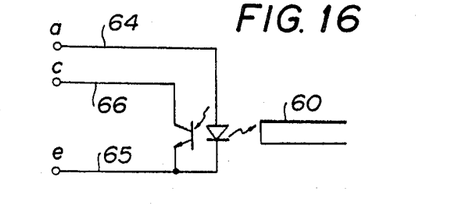
FIG. 16 is a view showing the device of the second example with circuit symbols.

FIG. 15 is a view showing a state in which an optical fiber 60 is coupled to the above described light emitting and receiving device. At a position about 60 μm from above a luminous surface E of the central portion and a light receiving surface D in the peripheral portion, there is situated, for instance, an end face of the optical fiber 60 with a core 61 in diameter 200–400 μm. An external lead-out wire 65 (corresponding to emitter of phototransistor) from an electrode 40, external lead-out wire 66 (corresponding to collector of phototransistor) from the other electrode 41 further external lead-out wire 64 (corresponding to anode of light emitting diode) from an electrode 43 are drawn out. (Refer to FIG. 16.)

When negative voltage is applied to the lead-out wire 65 and positive voltage to 66, the light receiving part operates as a phototransistor.

Now for propagation of light from the core 61 of the optical fiber, energy of light irradiated to the light receiving surface D is converted into a photocurrent further with current amplification to $h_{FE}$ times by transistor action. For large optical input, a state of electric conduction is likely obtained between collector and emitter, and the conversion can be performed into a digital signal of level "0" and "1" without further providing an external amplifier circuit of high gain.

Now in case of application with negative voltage to the lead-out wire 65 and positive voltage to the wire 64, the light emitting part performs as a light emitting diode. The flow of a Pn junction current is reduced by the ion implanted layer 34 due to its high resistance. Consequently, the Pn junction current causes spot shaped emission of light with a high level of luminance at a Pn junction surface and is coupled to the core 61 of the optical fiber 60 then propagated in the core at an optical level.

Now referring to FIGS. 17-20, there is the description for the third modification of a light emitting and receiving device relating to this invention.

Figure 17:
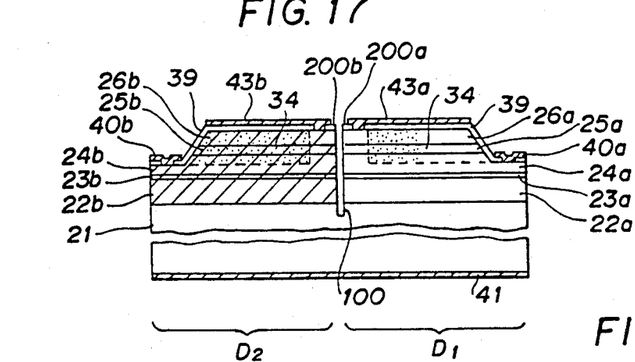
FIG. 17 is a sectional view showing the third example of the device relating to this invention.
Figure 18:
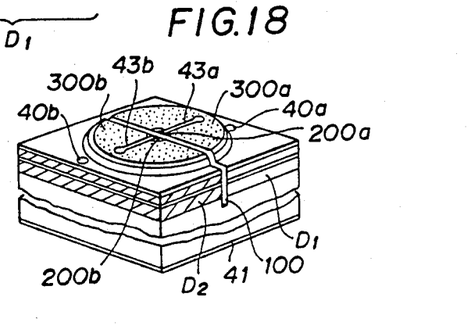
FIG. 18 is a diagonal view for the device of the third example.
Figure 19:
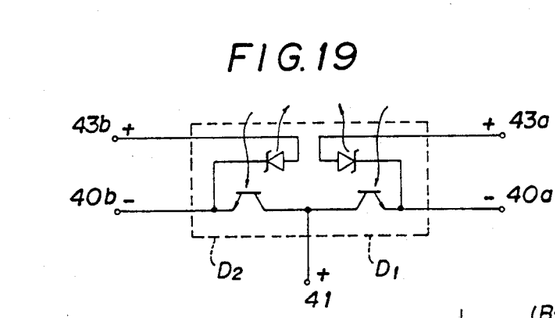
FIG. 19 is a view showing the device of the third example with circuit symbols.

A device in this modification of the third example is of such constitution that two sets of light emitting diodes and phototransistors are integrated into a semiconductor chip. The light emitting diode and phototransistor in each set are fundamentally of the same construction as in the before described second example. The elements are arranged, as shown in FIGS. 17 and 18, in such a manner that the circular region of a wafer is divided by a groove 100 into two semicircular regions $D_1$, $D_2$. In each of the two semicircular regions $D_1$, $D_2$ a set of light emitting diode and phototransistor is provided. Further luminous surfaces 200a, 200b of the two light emitting diodes are situated in the central part of the above described circular region, then light receiving surfaces 300a, 300b of the two phototransistors are located in the periphery of said circular region. In summary, the element divided into the two sets of light emitting diodes and phototransistors by the groove 100 in the second example. And the elements at the both sides of said groove 100 provided with different composition from each other allow the spectrum characteristic of the light emitting diode and phototransistor in each set be different. There is shown as follows composition of each layer in the device illustrated in FIGS. 17, 18.

21 . . . n+-type GaAs substrate
22a . . n−-type GaAs layer
22b . . n-type Al0.2Ga0.8As layer (Te dope)
23a . . p-type GaAs layer
23b . . p-type Al0.2Ga0.8As layer (Ge dope)
24a . . n-type Al0.2Ga0.8As layer (Te dope)
24b . . n-type Al0.5Ga0.5As layer (Te dope)
25a . . Al0.05Ga0.95As layer (non-dope)
25b . . Al0.25Ga0.75As layer (non-dope)
26a . . p-type Al0.2Ga0.8As layer (Ge dope)
26b . . p-type Al0.5Ga0.5As layer (Ge dope)
34 . . . H+ ion implanted layer
39 . . . Si3N4 film And referring to FIG. 19 as illustrated by circuit symbols, an electrode 41 formed on the bottom surface of the substrate 21 is used for the common collector electrode of the two phototransistors. An electrode 40a formed in an n-type layer 24a serves as an emitter-cathode common electrode for one set of phototransistor and light emitting diode. An electrode 40b formed in an n-type layer 24b serves as an emitter-cathode common electrode for the other set of phototransistor and light emitting diode. Further electrodes 43a, 43b formed in p-type layers 26a, 26b respectively serve as anode electrodes for the two light emitting diodes respectively.

Figure 20:
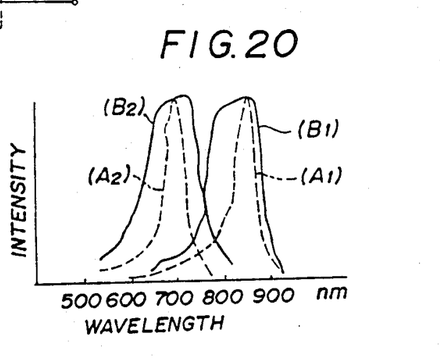
FIG. 20 is a diagram of light emitting and light receiving spectrum characteristics in the device of the third example.

Referring to FIG. 20, ($A_1$) is the luminous characteristic of a light emitting diode at the side of the semicircular region $D_1$, ($B_1$) for the light receiving characteristic of a phototransistor at the side of $D_1$, ($A_2$) the luminous characteristic of a light emitting diode at the side of the semicircular region $D_2$ and ($B_2$) the light receiving characteristic of a phototransistor at the side of $D_2$. As shown in said FIG. 20, the distribution of luminous spectrum of light emitting diodes and the sensitivity distribution of spectrum of phototransistors in the both sets are abmost indentical with a difference of distribution between spectra in the two sets.

Accordingly, in this modification of the third example of a light emitting and receiving device, a wave length multiplex bidirectional optical communication system can be constituted by using a single optical fiber.

In addition to the above described example, although the light emitting part is applied to the double hetero junction, there is only required a wider band gap of the layer for the light emitting part than that for the light receiving part, and application of the homo junction may be substituted. While though the light receiving part is formed to a hetero junction phototransistor of wide gap emitter base open type, a base terminal may be extended to the outside or with a general phototransistor available without application of hetero junction. Further in the above example though the flow of an electric current is reduced by the method of ion implantation, the method of current reduction, being provided with various kinds, will not be limited to the ion implantation. Further for the above example though the description was performed by using a GaAa-AlGaAs mixed crystal system, the composition of semiconductors will not be limited to the above and it is obvious that a semiconductor of the other composition of InP, InGaAs, InGaAsP and the like may be used.

What we claim is:

1. A light-emitting and receiving device integrated into a single semiconductor chip comprising:
    a substrate of a first conductivity type defining the collector of a base open phototransistor;
    a first layer of the second type of conductivity formed on one side of said substrate and defining the base of said open phototransistor;
    a second layer of said first type of conductivity formed on said first layer and defining the emitter of said open phototransistor,
    said first and second layers being separated into at least one central photo-emitting region and at least one photo-sensitive receiving region outward from said photo-emitting region,
    a first contact on the opposite side of said substrate defining a first terminal,
    second contacts on said layer in said photo-emitting and photo-sensitive regions and defining a pair of second terminals so that application of an electrical signal to one of said second terminals causes said light-emitting region to emit light and application of an electrical signal to the other of said second terminals causes said photo-sensitive region to produce an electrical signal in response to incident radiation; and
    a groove separating said layers into at least two photo-transistors each having a central photo-emitting region and a photo-sensitive region outward therefrom.

2. A device as in claim 1 wherein said first and second layers have a circular groove separating said central photo-emitting region and said receiving region so that said photo-receiving region surrounds said photo-emitting region.

3. A device as in claim 1 wherein said light receiving region is implanted with ions to form a high resistance layer.

4. A device as in claim 1 wherein the area of said light receiving region is greater than the area of said photoemitting region.

5. A device as in claim 1 wherein there are provided at least two pairs of light emitting and receiving devices which differ from each other in sensitive wavelength.

* * * * *